(12) United States Patent
Song

(10) Patent No.: US 7,759,676 B2
(45) Date of Patent: Jul. 20, 2010

(54) THIN FILM TRANSISTOR ARRAY PANEL HAVING GROUPS OF PROXIMATELY LOCATED THIN FILM TRANSISTORS AND MANUFACTURING METHOD THEREOF

(75) Inventor: Keun-Kyu Song, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 77 days.

(21) Appl. No.: 11/551,764

(22) Filed: Oct. 23, 2006

(65) Prior Publication Data

US 2007/0262308 A1 Nov. 15, 2007

(30) Foreign Application Priority Data

May 9, 2006 (KR) ...................... 10-2006-0041387

(51) Int. Cl.
H01L 31/00 (2006.01)
H01L 31/036 (2006.01)
H01L 21/00 (2006.01)
H01L 51/40 (2006.01)
H01L 21/31 (2006.01)

(52) U.S. Cl. ............................. 257/40; 257/59; 257/72; 257/E51.005; 257/E51.006; 438/82; 438/99; 438/780

(58) Field of Classification Search .................. 257/40, 257/59, 72, E51.005, E51.006; 438/99, 128, 438/129
See application file for complete search history.

(56) References Cited

U.S. PATENT DOCUMENTS

| 6,618,029 | B1 * | 9/2003 | Ozawa ........................ 345/82 |
| 7,423,290 | B2 * | 9/2008 | Yamazaki et al. ............. 257/59 |
| 2004/0021807 | A1 * | 2/2004 | Narutaki et al. ............. 349/106 |
| 2005/0073487 | A1 * | 4/2005 | Matsumoto ................... 345/76 |
| 2005/0083279 | A1 * | 4/2005 | Lee et al. ....................... 345/87 |
| 2005/0230351 | A1 * | 10/2005 | Tahara .......................... 216/67 |
| 2005/0247932 | A1 * | 11/2005 | Huang et al. .................. 257/59 |
| 2005/0287721 | A1 * | 12/2005 | Yamamoto et al. .......... 438/149 |
| 2006/0220541 | A1 * | 10/2006 | Koyama ..................... 313/506 |

FOREIGN PATENT DOCUMENTS

KR 1020050023012 * 3/2005

* cited by examiner

Primary Examiner—Hsien-ming Lee
Assistant Examiner—Kevin Parendo
(74) Attorney, Agent, or Firm—Cantor Colburn LLP

(57) ABSTRACT

A thin film transistor array panel includes a substrate with a plurality of gate lines and data lines crossing each other, wherein the gate lines and the data lines define pixel groups each including a plurality of pixels, and a plurality of thin film transistors are connected to the gate lines and the data lines and include an organic semiconductor, wherein the thin film transistors from adjacent pixels of different pixel groups are disposed proximate to one another.

14 Claims, 21 Drawing Sheets

THIN FILM TRANSISTOR ARRAY PANEL HAVING GROUPS OF PROXIMATELY LOCATED THIN FILM TRANSISTORS AND MANUFACTURING METHOD THEREOF

This application claims priority to Korean Patent Application No. 10-2006-0041387, filed on May 9, 2006, and all the benefits accruing therefrom under 35 U.S.C. §119, the contents of which in its entirety are herein incorporated by reference.

BACKGROUND OF THE INVENTION (a) Field of the Invention

The present invention relates to a thin film transistor array panel and a manufacturing method thereof.

(b) Description of the Related Art

Generally, a flat panel display such as a liquid crystal display ("LCD"), an organic light-emitting diode ("OLED") display, and an electrophoretic display includes a pair of electric-field generating electrodes and an electro-optical active layer disposed therebetween. The LCD includes a liquid crystal layer as the electro-optical active layer, and the OLED display includes an organic light-emitting layer as the electro-optical active layer.

One of the pair of field generating electrodes is usually coupled with a switching element to receive electrical signals, and the electro-optical active layer converts the electrical signals into optical signals to display images.

The switching element for the flat panel display usually includes a thin film transistor ("TFT") having three terminals, and gate lines transmitting control signals for controlling the TFTs and data lines transmitting data signals to be supplied for the pixel electrodes through the TFTs are also provided in the flat panel display.

Among the various types of TFTs, organic thin film transistors ("OTFT") are being vigorously developed. An OTFT includes an organic semiconductor instead of an inorganic semiconductor such as Si.

An OTFT panel having OTFTs in a matrix alignment has several structural and manufacturing method differences when compared with conventional TFTs.

As one difference, the OTFT panel may be manufactured by a solution process such as inkjet printing.

In the inkjet printing method, an organic solution is dripped in openings defined by a plurality of partitions. This method may be used to form organic thin films such as organic semiconductors and insulating layers.

However, there are potential complications to the inkjet printing method, such as when the organic solution is dripped in the openings, the organic solution may overflow out of the openings and flow in the pixels such that spots may be generated and the thicknesses of the organic thin films may be nonuniform, and ultimately the characteristics of the thin film transistors may be influenced.

BRIEF SUMMARY OF THE INVENTION

An exemplary embodiment of a thin film transistor array panel according to the present invention includes; a substrate, a plurality of gate lines and data lines crossing each other on the substrate which form substantially a matrix pattern, wherein the gate lines and the data lines define a plurality of pixel groups each including a plurality of pixels, and a plurality of thin film transistors in each pixel group connected to the gate lines and the data lines and including an organic semiconductor, wherein the thin film transistors from adjacent pixels of different pixel groups are disposed proximate to one another.

The organic semiconductors of the thin film transistors of at least two adjacent pixels may be simultaneously formed of an organic solution dispersed by one nozzle, and the organic semiconductors of the thin film transistors of at least two adjacent pixels may be separated.

The organic semiconductors of the thin-film transistors of at least two adjacent pixels may be joined.

The gate lines between adjacent pixels in the same column may be paired and the data lines between adjacent pixels in the same row may be paired.

The organic semiconductors may include a soluble material.

The thin film transistor array panel may further include a plurality of gate insulators formed between the gate lines and the organic semiconductors, and the gate insulators may include a soluble material.

The gate insulators of at least two adjacent pixels may be simultaneously formed of a gate insulating solution dispersed by one nozzle.

The thin film transistor array panel may further include a plurality of source electrodes connected to the data lines and a plurality of drain electrodes opposite the source electrodes with respect to the gate lines.

The drain electrodes and the source electrodes may include ITO or IZO.

The thin film transistor array panel may further include an insulating layer formed on the source electrodes and the drain electrodes, wherein the insulating layer includes a plurality of openings exposing the portions of the source and the drain electrodes, and the organic semiconductors may be formed in the openings.

The openings of adjacent pixels may be disposed proximate to one another, and the number of pixels in the plurality of pixel groups may be four.

The pixels of adjacent pixels of different pixel groups may have inversion symmetry.

A method of manufacturing a thin film transistor array panel comprising a plurality of pixel groups, each pixel group comprising at least two pixels, includes; forming a plurality of pairs of data lines on a substrate, forming a first insulating layer on the data lines, forming a plurality of pairs of gate lines on the first insulating layer, forming a second insulating layer on the gate lines, forming a plurality of first openings in the second insulating layer which expose portions of the gate lines, forming a plurality of gate insulators in the first openings, forming a plurality of source electrodes connected to the data lines and a plurality of drain electrodes opposite the source electrodes on the gate insulators, forming a third insulating layer on the source and the drain electrodes, forming a plurality of second openings in the third insulating layer which expose the portions of the source and the drain electrodes, and forming a plurality of organic semiconductors in the second openings. At least one of forming the gate insulators and forming the organic semiconductors is performed by inkjet printing, and in the inkjet printing process an organic solution is dispersed through one nozzle in two or more adjacent pixels.

One of the first openings of two or more adjacent pixels may be formed proximate to one another and the second openings of two or more adjacent pixels may be formed proximate to one another.

One of the first openings of two or more adjacent pixels may be formed joined together and the second openings of two or more adjacent pixels may be formed joined together.

BRIEF DESCRIPTION OF THE DRAWINGS

The present invention will become more apparent by describing exemplary embodiments thereof in detail with reference to the accompanying drawings, in which.

DETAILED DESCRIPTION OF THE INVENTION

Figure 1:
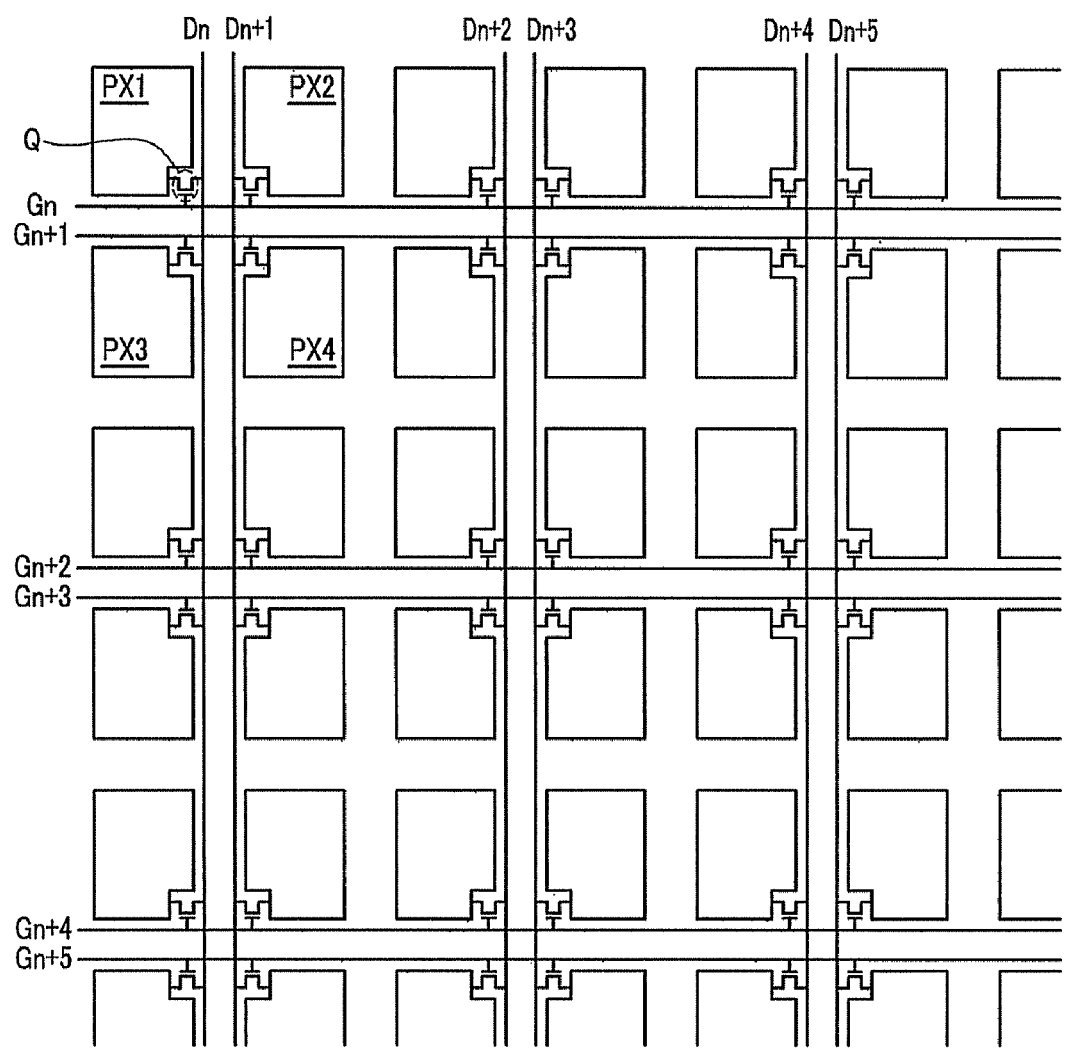
FIG. 1 is a schematic view showing a pixel alignment in an exemplary embodiment of an organic thin film transistor array panel according to the present invention.

The invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments of the present invention are described herein with reference to cross section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

Hereinafter, the present invention will be described in more detail with reference to the accompanying drawings.

An exemplary embodiment of an organic thin film transistor ("OTFT") array panel for an LCD according to the present invention will be described with reference to FIGS. 1 and 5.

Figure 2:
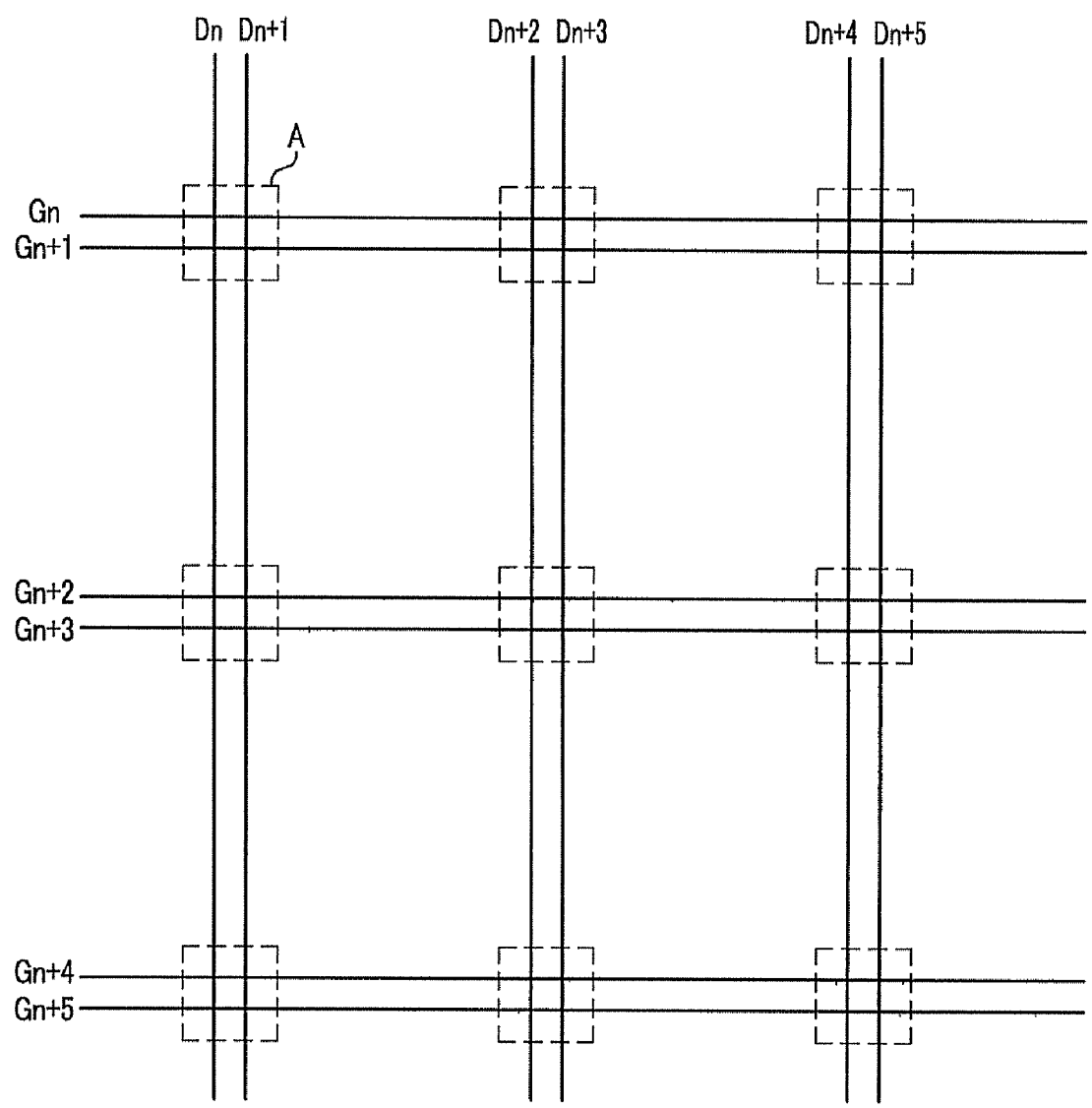
FIG. 2 is a schematic view showing an enlarged portion of the exemplary embodiment of an organic thin film transistor array panel of FIG. 1.
Figure 3:
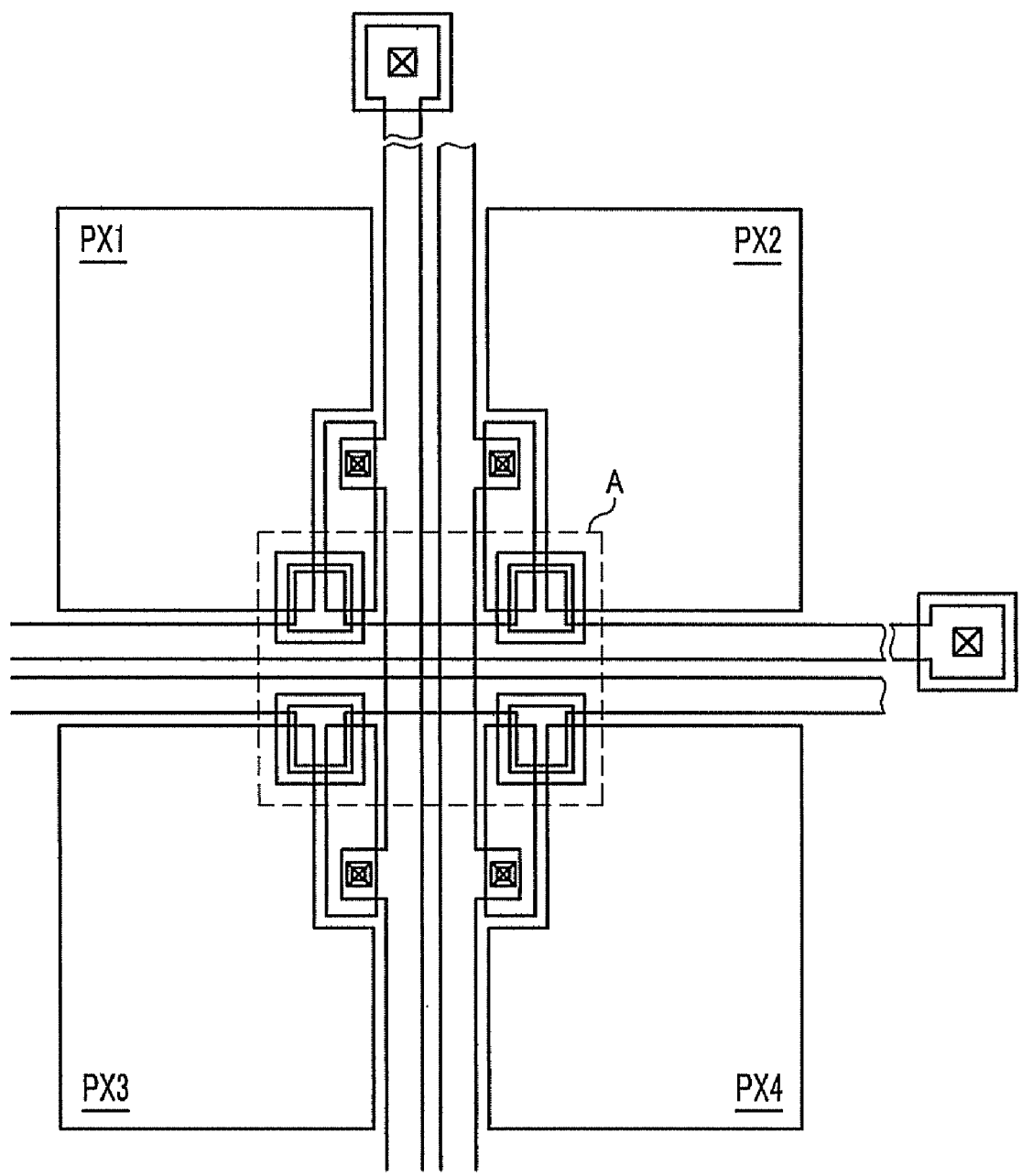
FIG. 3 is a top plan layout view showing an enlarged portion of the exemplary embodiment of an organic thin film transistor array panel of FIGS. 1 and 2.
Figure 4:
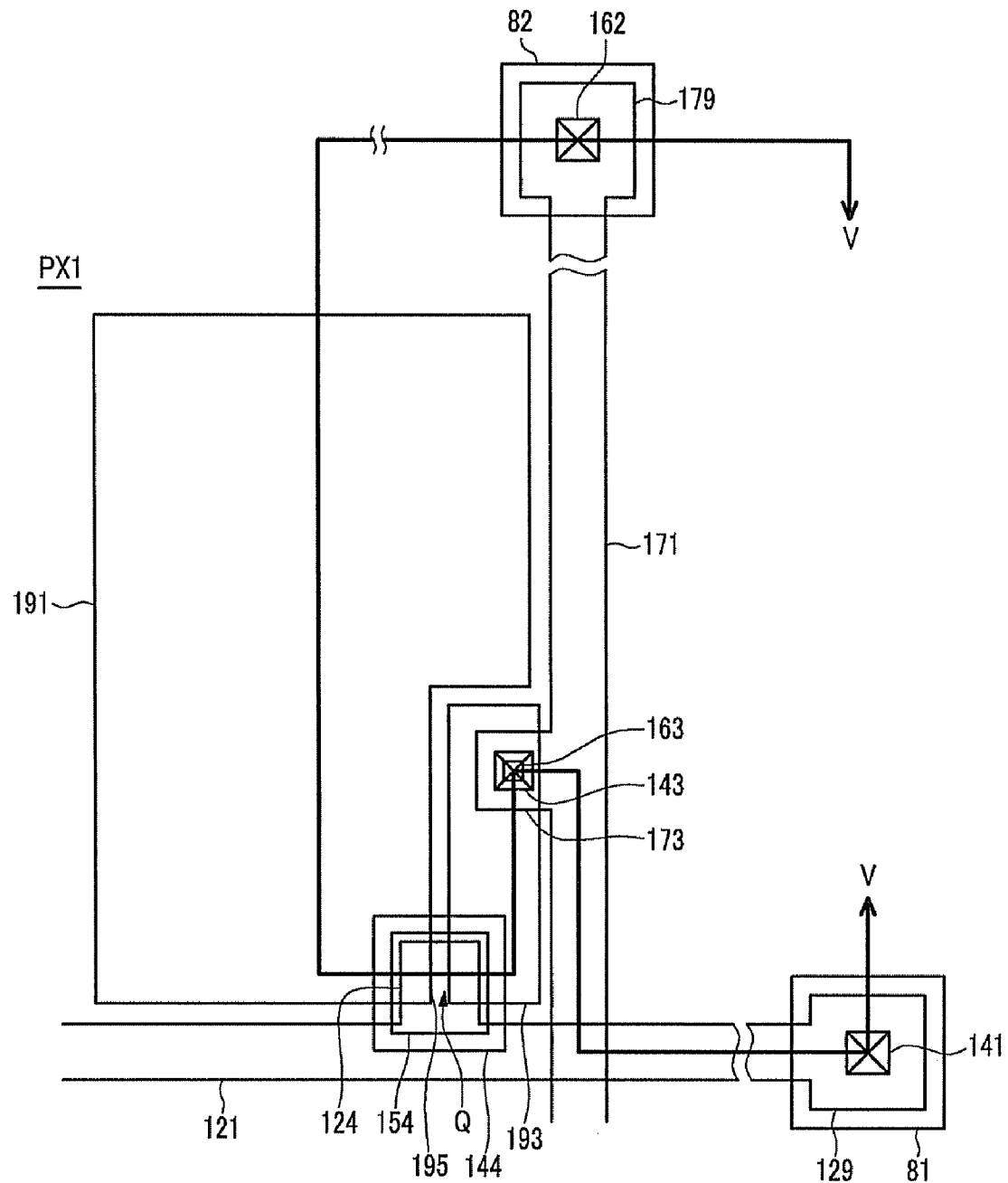
FIG. 4 is a top plan layout view of one pixel PX1 in the exemplary embodiment of an organic thin film transistor array panel of FIG. 3 according to the present invention.
Figure 5:
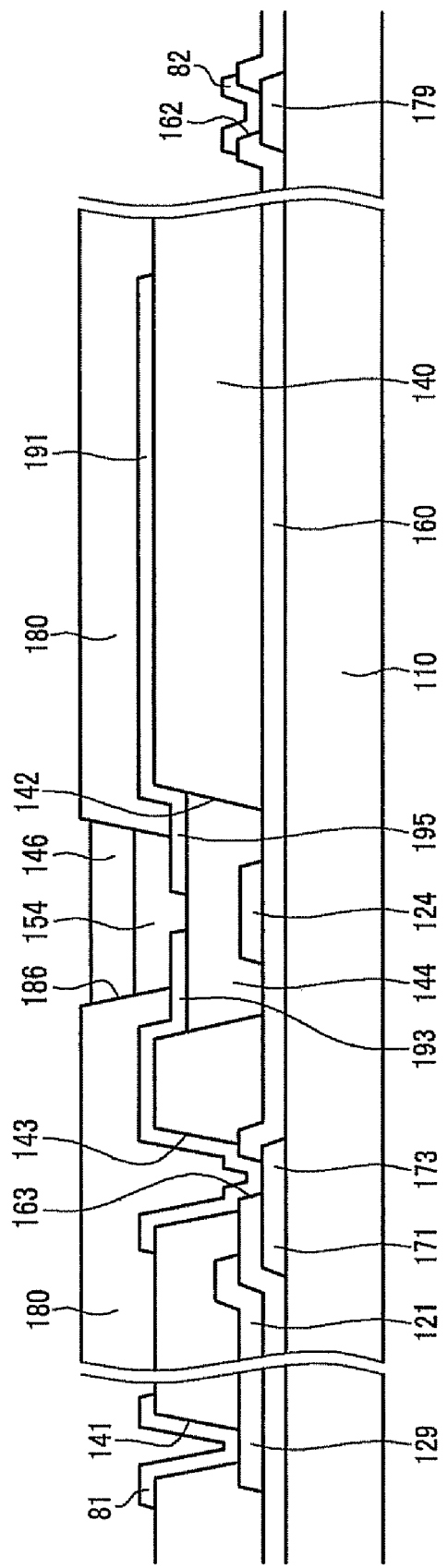
FIG. 5 is a cross-sectional view of the organic thin film transistor array panel shown in FIG. 4 taken along line V-V.

FIG. 1 is a schematic view showing a pixel alignment in an exemplary embodiment of an organic thin film transistor array panel according to the present invention, FIG. 2 is a schematic view showing an enlarged portion of the exemplary embodiment of an OTFT array panel of FIG. 1, FIG. 3 is a top plan layout view showing an enlarged view of four pixels PX1, PX2, PX3, and PX4 in the exemplary embodiment of an OTFT array panel of FIGS. 1 and 2, FIG. 4 is a top plan layout view of one pixel PX1 in the exemplary embodiment of an OTFT array panel of FIG. 3 according to the present invention, and FIG. 5 is a cross-sectional view of the OTFT array panel shown in FIG. 4 taken along line V-V.

A plurality of gate lines Gn, G(n+1), G(n+2) . . . and a plurality of data lines Dn, D(n+1), D(n+2) . . . cross each other to define a plurality of pixels PX. The plurality of pixels are arranged in a thin film transistor array panel according to an exemplary embodiment of the present invention. Also, a thin film transistor Q, which is connected to the gate line and the data line, is formed in each pixel PX.

As shown in FIG. 1 the gate lines Gn, G(n+1), G(n+2) . . . and the data lines Dn, D(n+1), D(n+2) . . . are arranged in pairs so that a grouping of four pixels PX is formed around the intersection of the pairs of data and gate lines. In one exemplary embodiment a plurality of light blocking members for preventing light leakage between the pixels may be formed between adjacent pixels not separated by gate lines and data lines.

A plurality of thin film transistors Q are formed in the portion of the OTFT array panel where the paired gate lines and the paired data lines are crossed, such that four thin film transistors are located in proximity to one another in the portion of the OTFT array panel where the paired gate lines and the paired data lines are crossed.

The thin film transistors Q are opposite to each other with respect to the paired gate lines and the paired data lines, and in one exemplary embodiment these pixels have inversion symmetry with adjacent pixels, e.g., as shown in FIG. 1 PX1 has an inversion symmetry with PX4 and PX2 has an inversion symmetry with PX3.

When the thin film transistors are not separated by data lines, the interval between their respective thin film transistors is doubled. For example, the thin film transistors of the pixels located immediately above and below the gate lines Gn and G(n+1) and immediately to the right of the data lines Dn and D(n+1) have inversion symmetry with and are opposite to the thin film transistors of the pixels located immediately above and below the gate lines Gn and G(n+1) and immediately to the left of the data lines D(n+2) and D(n+3), and the distance interval between these sets of transistors is larger than the distance interval between the transistors around the intersection of the data and gate lines.

In FIG. 2, "A" is a portion of the OTFT array panel where four thin film transistors are located in close proximity, and four pixels PX1, PX2, PX3, and PX4 including the region "A" of FIG. 2 are showed in an enlarged view in FIG. 3.

As described above, the plurality of thin film transistors are located in close proximity in this exemplary embodiment so that organic thin films, which may be used to construct the organic semiconductors or an organic insulating layer, may be simultaneously formed by an organic solution dispersed through a single nozzle, thereby reducing manufacturing costs. Additionally, because the intervals between the thin film transistors of pixels which are adjacent along a separate pair of gate or data lines are increased the organic solution which is dispersed through the single nozzle may be prevented from overflowing into these more distant pixels. Accordingly, the thickness of each pixel may be made uniform.

An exemplary embodiment of one pixel PX1 of the OTFT array panel according to the present invention will be described in more detail with reference to FIGS. 4 and 5 as well as FIGS. 1 through 3 as described above.

As shown in FIGS. 3, 4 and 5, a plurality of data lines 171 are formed on an insulating substrate 110. Exemplary embodiments of the insulating substrate may be made of material such as transparent glass, silicone, or plastic.

The data lines 171 transmit data signals and extend substantially in a longitudinal direction. As described above, the data lines are arranged in pairs, however in FIGS. 4 and 5 only one data line 171 is shown. Each data line 171 includes a plurality of projections 173 protruding to a side of the data line 171, and an end portion 179 having a large area for contact with another layer or an external driving circuit. A data driving circuit (not shown) for generating data signals may be mounted on a flexible printed circuit ("FPC") film (not shown), which may be attached to the substrate 110, directly mounted on the substrate 110, or integrated onto the substrate 110. In an alternative exemplary embodiment the data lines 171 may extend to connect to a driving circuit which may be integrated on the substrate 110.

Exemplary embodiments of the data lines 171 may be made of a metal including Al or an Al alloy, Ag or a Ag alloy, Au or a Au alloy, Cu or a Cu alloy, Mo or a Mo alloy, Cr, Ta, or Ti. Alternative exemplary embodiments of the data lines may have a multi-layered structure including two conductive films (not shown) having different physical characteristics.

The lateral sides of the data lines 171 are inclined relative to a surface of the substrate 110, and the inclination angle thereof ranges from about 30 degrees to about 80 degrees.

An interlayer insulating layer 160 is formed on the data lines 171. The interlayer insulating layer 160 may be made of an inorganic insulator. Exemplary embodiments of the inorganic insulator include silicon nitride ("SiNx") and silicon oxide ("SiOx"). The thickness of the interlayer insulating layer 160 may be from about 2000 Å to about 4 microns.

The interlayer insulating layer 160 has a plurality of contact holes 162 exposing the end portions 179 of the data lines 171 and a plurality of contact holes 163 exposing the projections 173 of the data lines 171.

A plurality of gate lines 121 are formed on the interlayer insulating layer 160.

The gate lines 121 transmit gate signals and extend in a substantially transverse direction to intersect the data lines 171. As described above, the gate lines 121 are arranged in pairs. Each of the gate lines 121 includes a plurality of gate electrodes 124 projecting upward and an end portion 129 having a large area for contact with another layer or an external driving circuit. A gate driving circuit (not shown) for generating the gate signals may be mounted on an FPC film (not shown), which may be attached to the substrate 110, directly mounted on the substrate 110, or integrated onto the substrate 110. In an alternative exemplary embodiment the gate lines 121 may extend to connect to a driving circuit which may be integrated on the substrate 110.

The gate lines 121 may be made of a conductor material having low resistivity such as that of the data lines 171.

The lateral sides of the gate lines 121 are inclined relative to a surface of the substrate 110, and their inclination angles range from about 30 to about 80 degrees.

A lower partition 140 is formed on the gate lines 121 and the interlayer insulating layer 160. Exemplary embodiments of the lower partition 140 may be made of an organic insulator. Exemplary embodiments of the organic insulator include a soluble high molecular weight compound such as a polyacryl compound, a polystyrene compound, and benzocyclobutane ("BCB"). The thickness of the insulating layer 140 may be from about 5000 Å to about 4 microns.

The lower partition 140 is not deposited on the end portions 179 of the data lines 171, this prevents the detachment of the interlayer insulating layer 160 and the lower partition 140 near the end portions 179 of the data lines 171 due to the poor adhesion between the layers 160 and 140. The absence of the lower partition 140 on the end portion 179 also enhances the adhesion between the end portions 179 of the data lines 171 and an external circuit.

The lower partition 140 has a plurality of openings 142 exposing the gate electrodes 124, a plurality of contact holes 141 exposing the end portions 129 of the gate lines 121, and a plurality of contact holes 143 exposing the contact holes 163 and the projections 173 of the data lines 171.

A plurality of gate insulators 144 are formed in the openings 142 of the lower partition 140. The gate insulators 144 cover the gate electrodes 124, and have a thickness of about 1000 Å to about 10,000 Å. The sidewalls of the openings 142 are higher than the gate insulators 144 such that the lower partition 140 serves as a bank against the gate insulators 144. In the exemplary embodiment where the gate insulators 144 are formed using an ink jet method the openings 142 have a size which is sufficient to allow the surface of the gate insulators 144 to flatten as they dry.

Exemplary embodiments of the gate insulators 144 may be made of an inorganic insulator or an organic insulator. Exemplary embodiments of the organic insulator include a soluble high molecular weight compound such as a polyimide compound, a polyvinyl alcohol compound, and parylene. Exemplary embodiments of the inorganic insulator include silicon oxide which may have a surface treated with octadecyl-trichloro-silane ("OTS").

A plurality of source electrodes 193, a plurality of drain electrodes 195, a plurality of pixel electrodes 191, and a plurality of contact assistants 81 and 82 are formed on the gate insulators 144, the lower partition 140, the end portion of the data line 179 and the end portion of the gate line 129. Exemplary embodiments of the source electrodes 193, the drain electrodes 195, the pixel electrodes 191 and the plurality of contact assistants 81 and 82 are made of a transparent conductor such as indium tin oxide ("ITO") or indium zinc oxide ("IZO") and have a thickness of about 300 Å to about 800 Å.

The difference in the work function between an organic semiconductor and the ITO layer or IZO layer may be so small that charge carriers can be effectively injected into the organic semiconductor from the source electrode 193 and the drain electrode 195 which are made of ITO or IZO. When the difference in the work function therebetween is small, a Schottky barrier generated between the organic semiconductor islands 154 (to be described in greater detail below) and the electrodes 193 and 195 may easily allow the injection and transport of the charge carriers.

The source electrodes 193 are connected to the projections 173 of the data lines 171 through the contact holes 143 and extend onto the gate insulators 144 above the gate electrodes 124.

Each of the pixel electrodes 191 includes a drain electrode 195 disposed on a gate insulator 144 opposite a source electrode 193 with respect to a gate electrode 124.

The contact assistants 81 and 82 are connected to the end portions 129 of the gate lines 121 and the end portions 179 of the data lines 171 through the contact holes 141 and 162, respectively. The contact assistants 81 and 82 protect the end portions 129 and 179 and enhance the adhesion between the end portions 129 and 179 and external devices.

A plurality of upper partitions 180 are formed on the source electrodes 193, the pixel electrodes 191, and the lower partition 140.

The upper partitions 180 have a plurality of openings 186 disposed corresponding to the gate electrodes 124 and the openings 142 of the lower partition 140 for exposing portions of the source electrodes 193 and the drain electrodes 195, and the portions of the gate insulators 144 therebetween.

Exemplary embodiments of the upper partitions 180 may be made of a photosensitive organic material which can be solution-processed, and the thickness of the upper partitions 180 is from about 5000 Å to about 4 microns.

The openings 186 of the upper partitions 180 are smaller than the openings 142 of the lower partition 140 disposed thereunder. Therefore, the upper partitions 180 fix the gate insulators 144 in place and function to prevent them from lifting and from being infiltrated by chemicals used in subsequent manufacturing processes.

A plurality of organic semiconductor islands 154 are formed in the openings 186 of the upper partitions 180. The organic semiconductor islands 154 are disposed on the gate electrodes 124 and contact the source electrodes 193 and the drain electrodes 195. The height of the organic semiconductor islands 154 is smaller than that of the upper partitions 180 in order to be completely confined by the upper partitions 180. Since the lateral surfaces of the organic semiconductor islands 154 are not exposed, chemicals used in later process steps are prevented from infiltrating the organic semiconductor islands 154 through the sides thereof.

Exemplary embodiments of the organic semiconductor islands 154 may include a high molecular weight compound or a low molecular weight compound which is soluble in an aqueous solution or an organic solvent, and in this exemplary embodiment, the organic semiconductor islands 154 can be formed by inkjet printing.

Exemplary embodiments of the organic semiconductor islands 154 may be made of or from derivatives of tetracene or pentacene with a substituent. Alternative exemplary embodiments include configurations where the organic semiconductor islands 154 may be made of an oligothiophene including four to eight thiophenes connected at the positions 2 and 5 of thiophene rings.

Exemplary embodiments of the organic semiconductor islands 154 may be made of polythienylenevinylene, poly 3-hexylthiophene, polythiophene, phthalocyanine, or metallized phthalocyanine or halogenated derivatives thereof. Alternative exemplary embodiments include configurations where the organic semiconductor islands 154 may be made of perylene tetracarboxylic dianhydride ("PTCDA"), naphthalene tetracarboxylic dianhydride ("NTCDA"), or their imide derivatives. The organic semiconductor islands 154 may also be made of perylene, coronene, or derivatives thereof with a substituent.

The thickness of the organic semiconductor islands 154 may be in the range of about 300 Å to about 5000 Å.

A gate electrode 124, a source electrode 193, a drain electrode 195, and an organic semiconductor island 154 form an OTFT Q. The OTFT Q has a channel formed in the organic semiconductor island 154 disposed between the source electrode 193 and the drain electrode 195. In one exemplary embodiment the opposing sides of the source electrodes 193 and the drain electrodes 195 may be curved, the width of the OTFT Q may thereby be maximized and the current characteristics of the OTFT may be improved.

The pixel electrodes 191 receive data voltages from the OTFT Q and generate an electric field in conjunction with a common electrode (not shown) of an opposing display panel (not shown) which is supplied with a common voltage, which determines the orientations of liquid crystal molecules (not shown) in a liquid crystal layer (not shown) disposed between the two electrodes. A pixel electrode 191 and the common electrode form a capacitor referred to as a "liquid crystal capacitor," which stores applied voltages even after the OTFT Q turns off.

A plurality of passivation members 146 are formed on the organic semiconductor islands 154. Exemplary embodiments of the passivation members 146 may be made of a fluorine hydrocarbon compound or a polyvinyl alcohol compound. The passivation members 146 protect the organic semiconductor islands 154 from external heat, plasma, and chemicals.

Now, a method of manufacturing the exemplary embodiment of an OTFT array panel shown in FIGS. 4 and 5 according to the present invention will be described in more detail with reference to FIGS. 6-19 as well as FIGS. 1-5.

Figure 6:
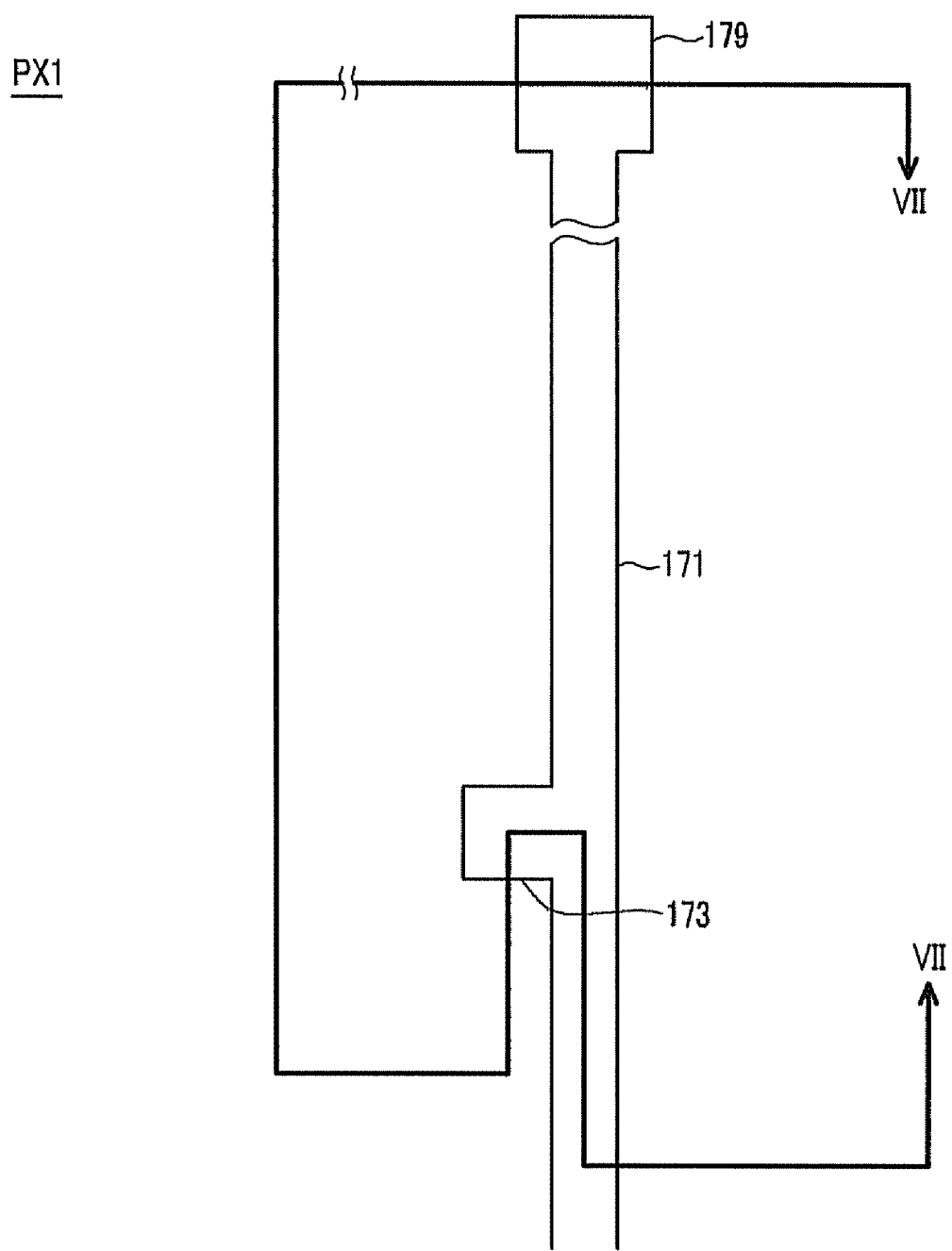
FIGS. 6, 8, 10, 12, 14, 16, and 18 are top plan layout views of the organic thin film transistor (OTFT) array panel shown in FIGS. 4 and 5 in intermediate steps of an exemplary embodiment of a manufacturing method thereof according to the present invention.
Figure 7:
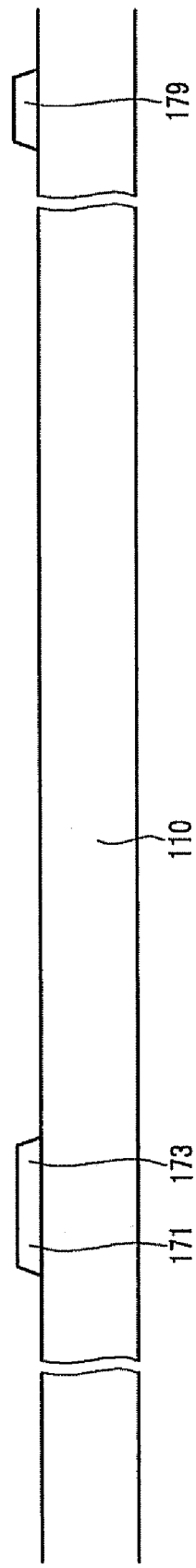
FIG. 7 is a cross-sectional view of the OTFT array panel shown in FIG. 6 taken along line VII-VII.
Figure 8:
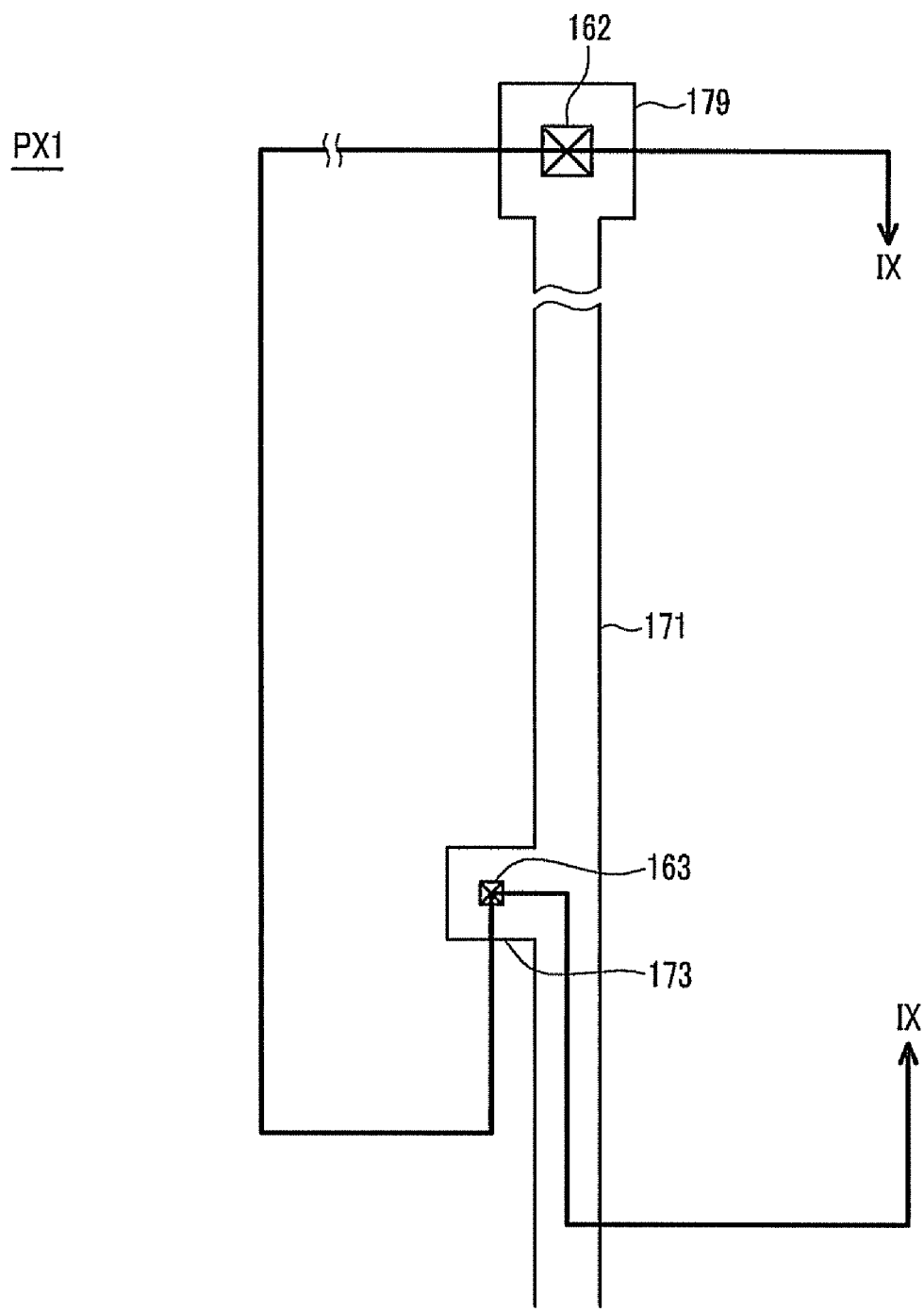
Figure 9:
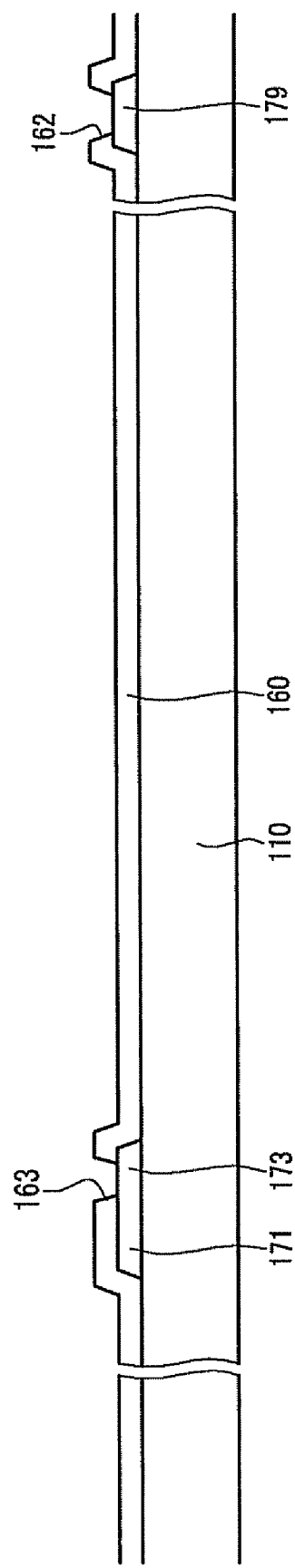
FIG. 9 is a cross-sectional view of the OTFT array panel shown in FIG. 8 taken along line IX-IX.
Figure 10:
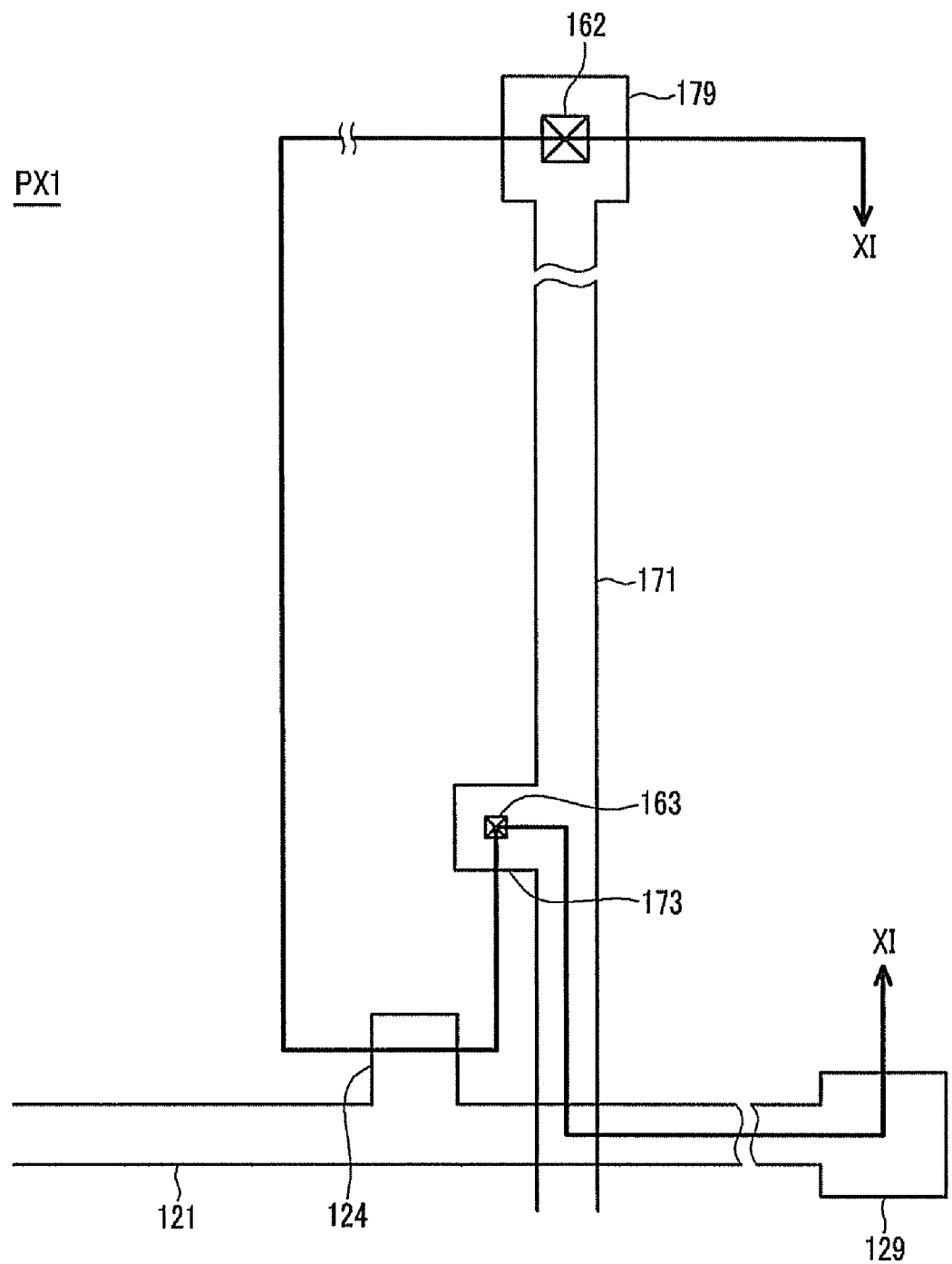
Figure 11:
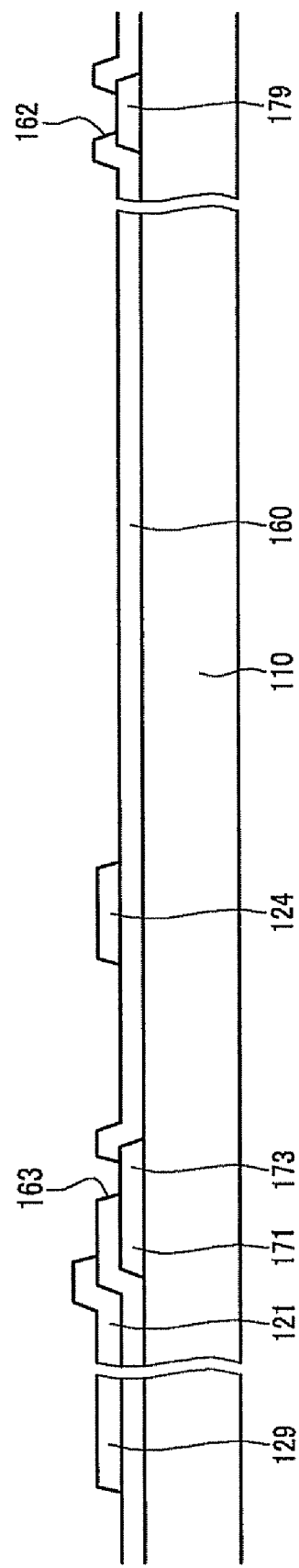
FIG. 11 is a cross-sectional view of the OTFT array panel shown in FIG. 10 taken along line XI-XI.
Figure 12:
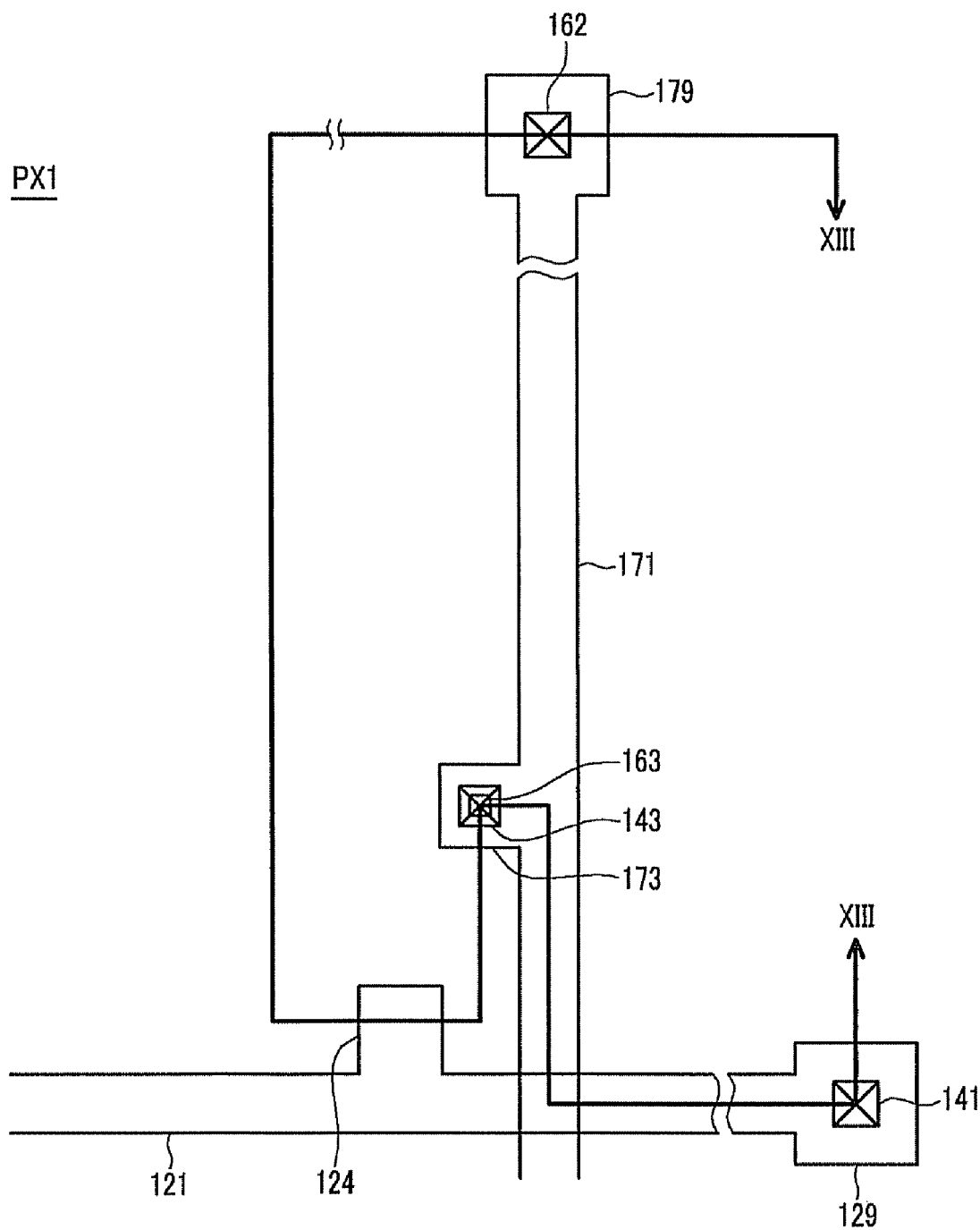
Figure 13:
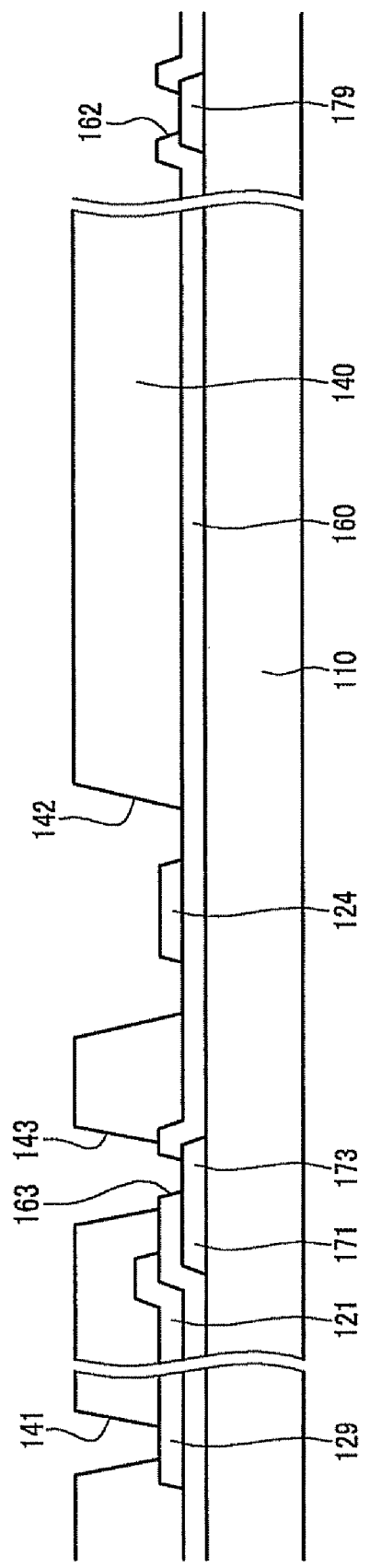
FIG. 13 is a cross-sectional view of the OTFT array panel shown in FIG. 12 taken along line XIII-XIII.
Figure 14:
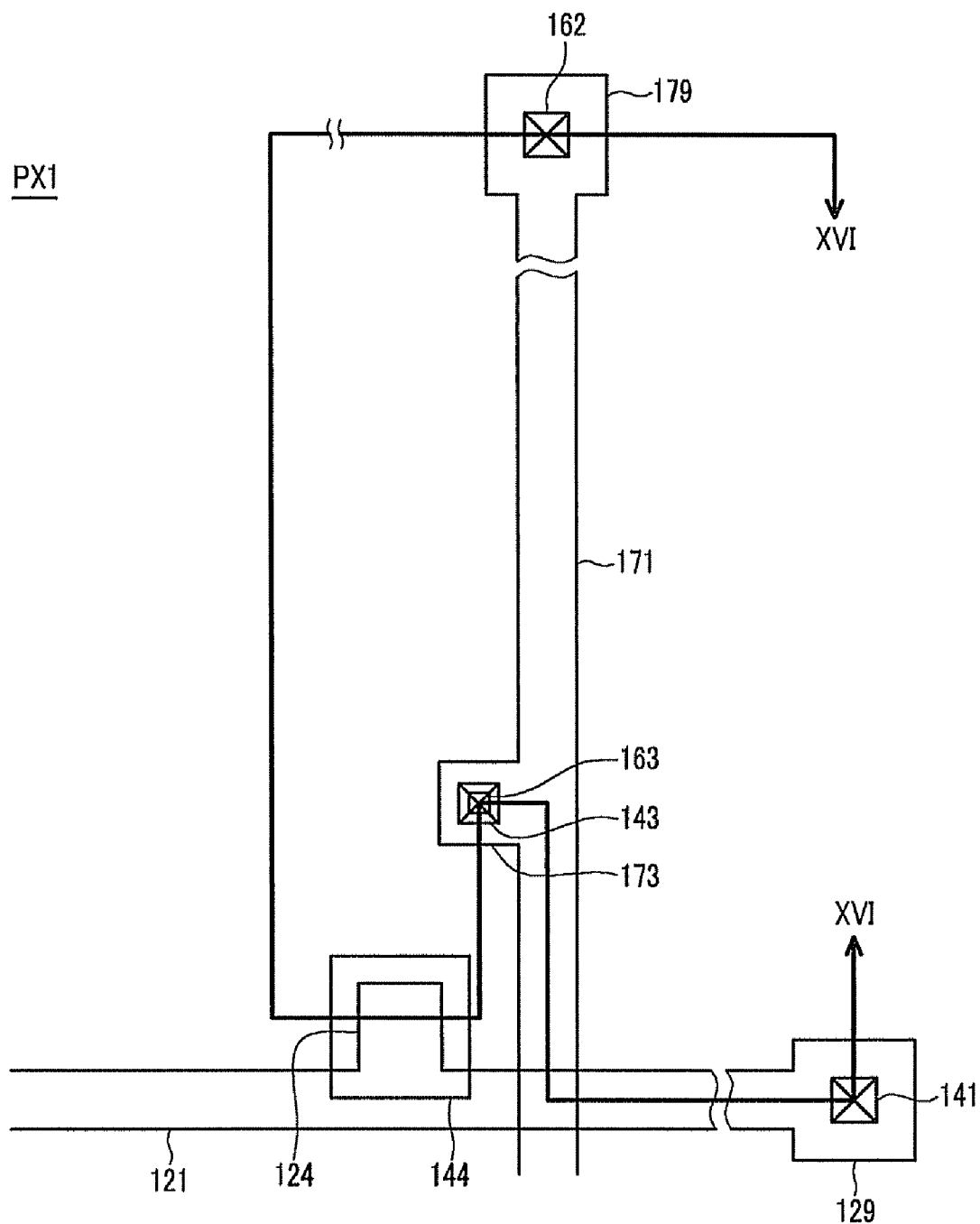
Figure 15:
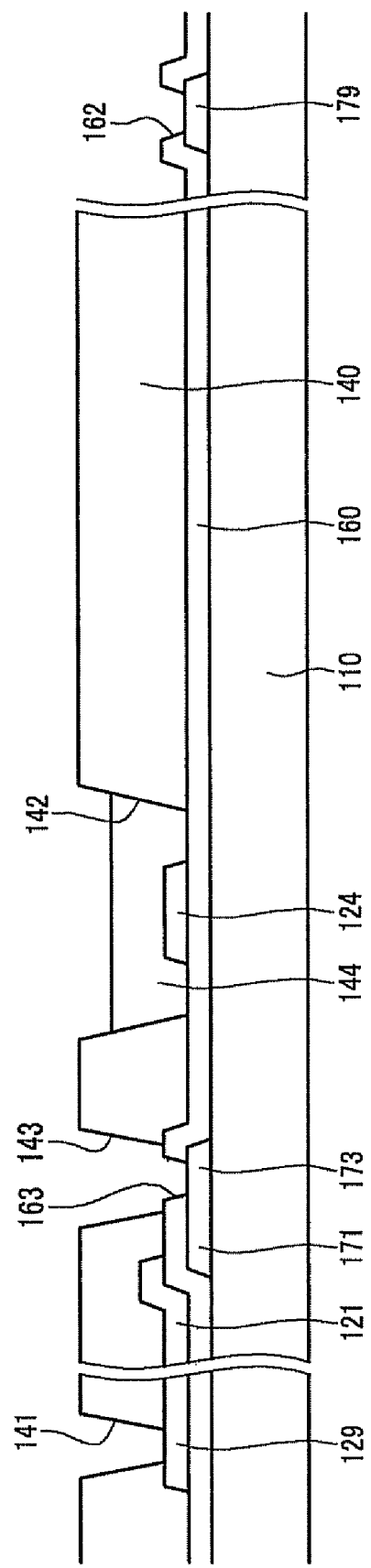
FIG. 15 is a cross-sectional view of the OTFT array panel shown in FIG. 14 taken along line XIV-XIV.
Figure 16:
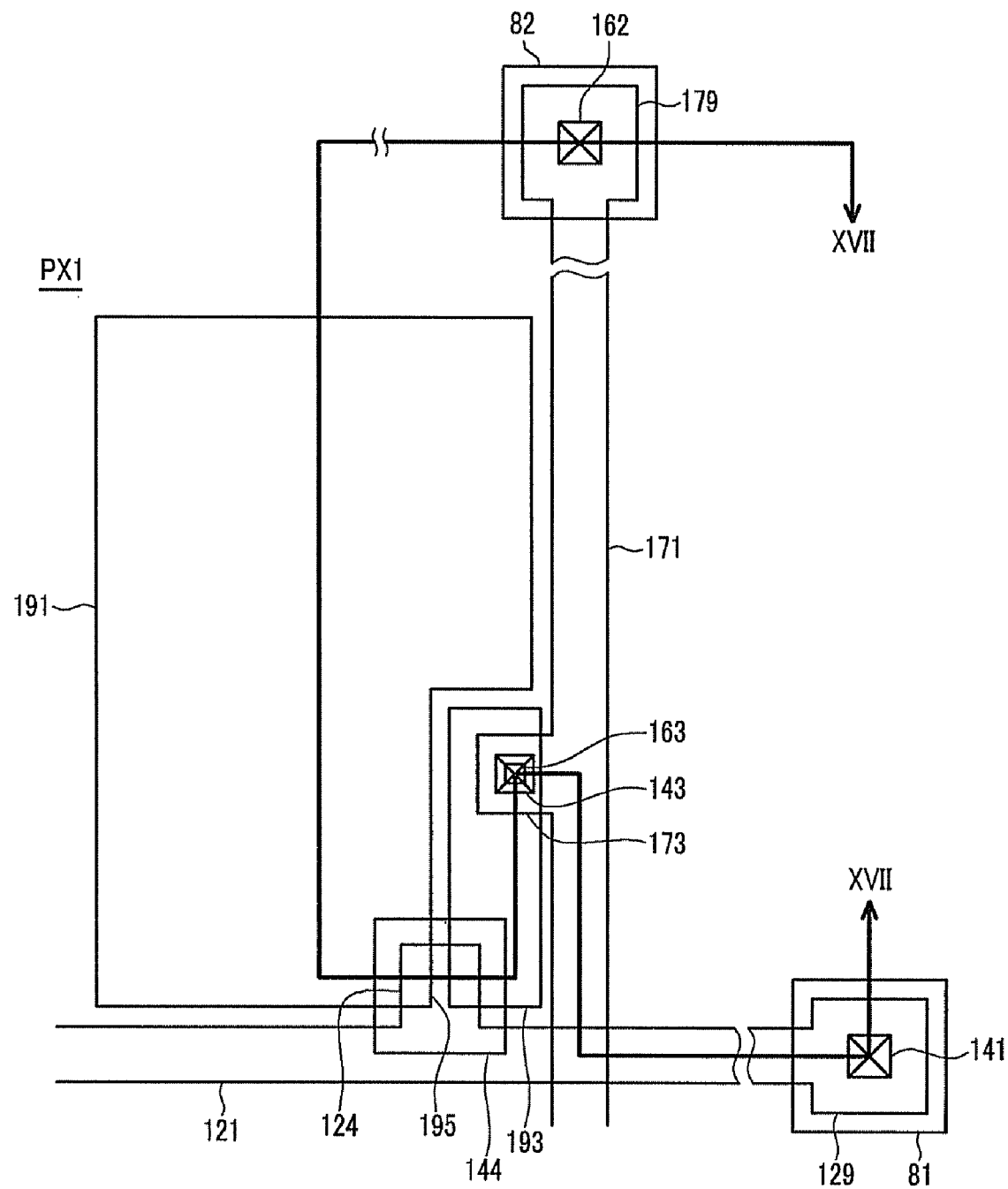
Figure 17:
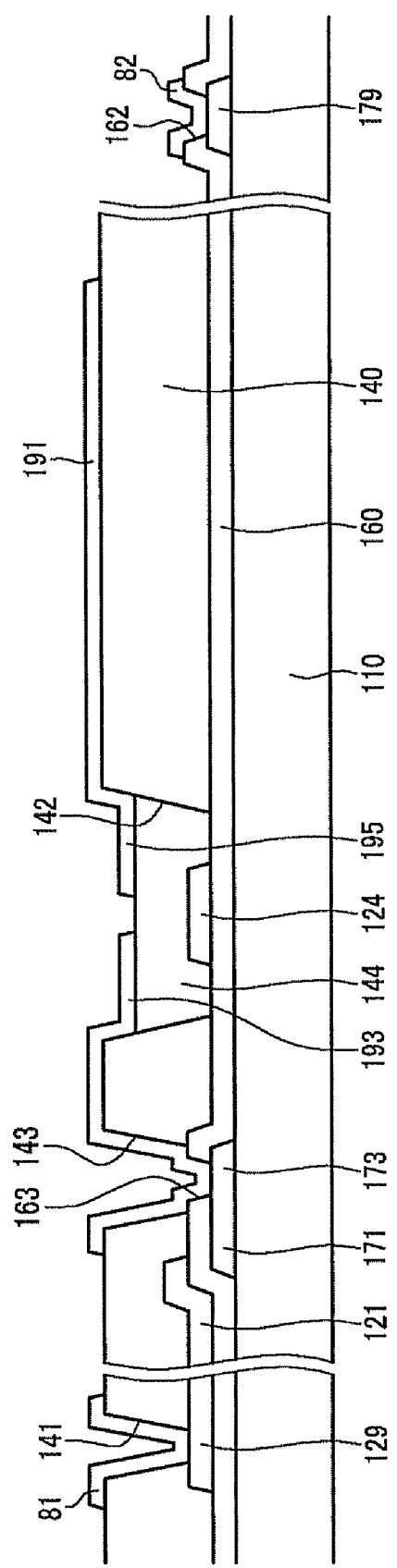
FIG. 17 is a cross-sectional view of the OTFT array panel shown in FIG. 16 taken along line XVII-XVII.
Figure 18:
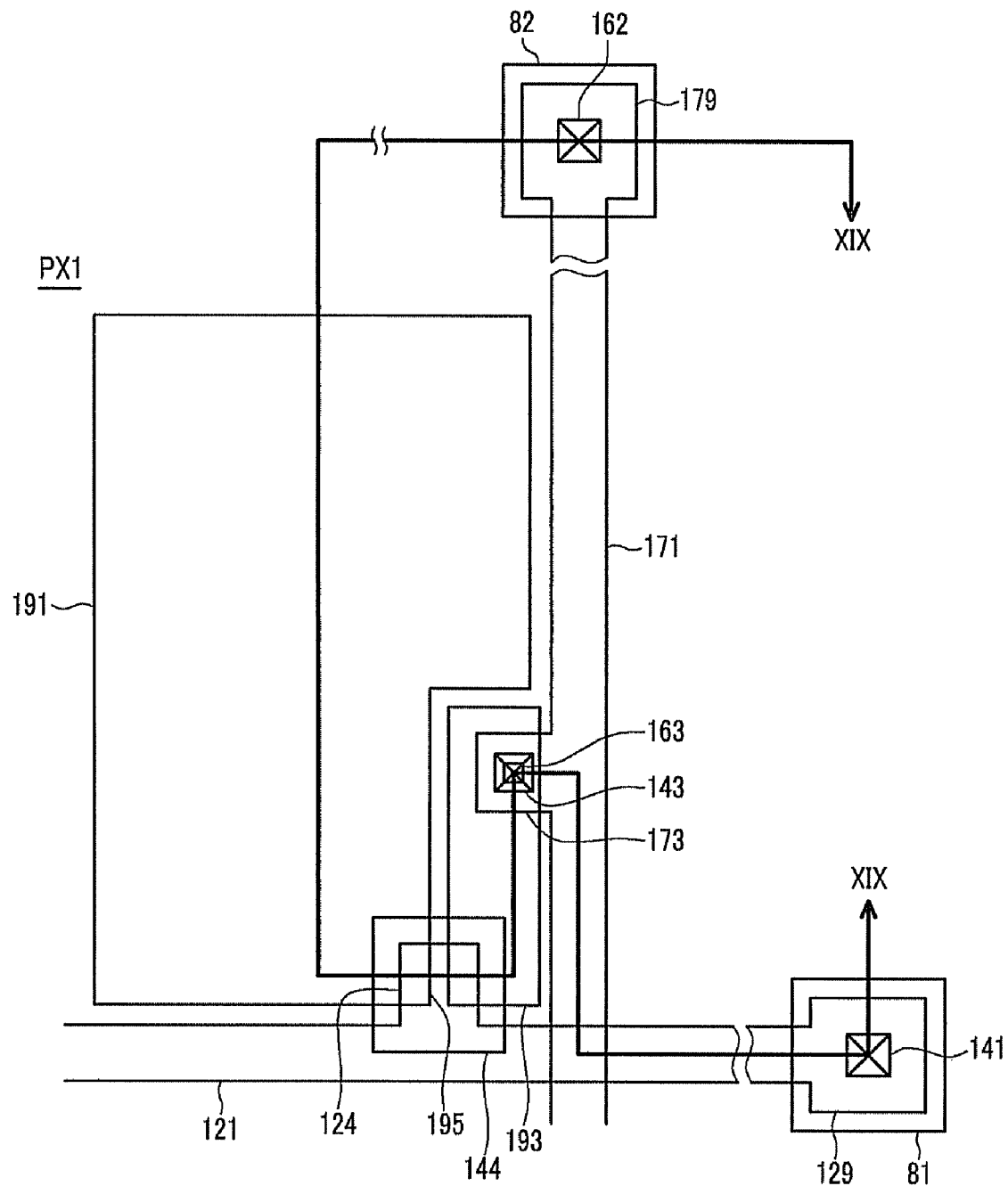
Figure 19:
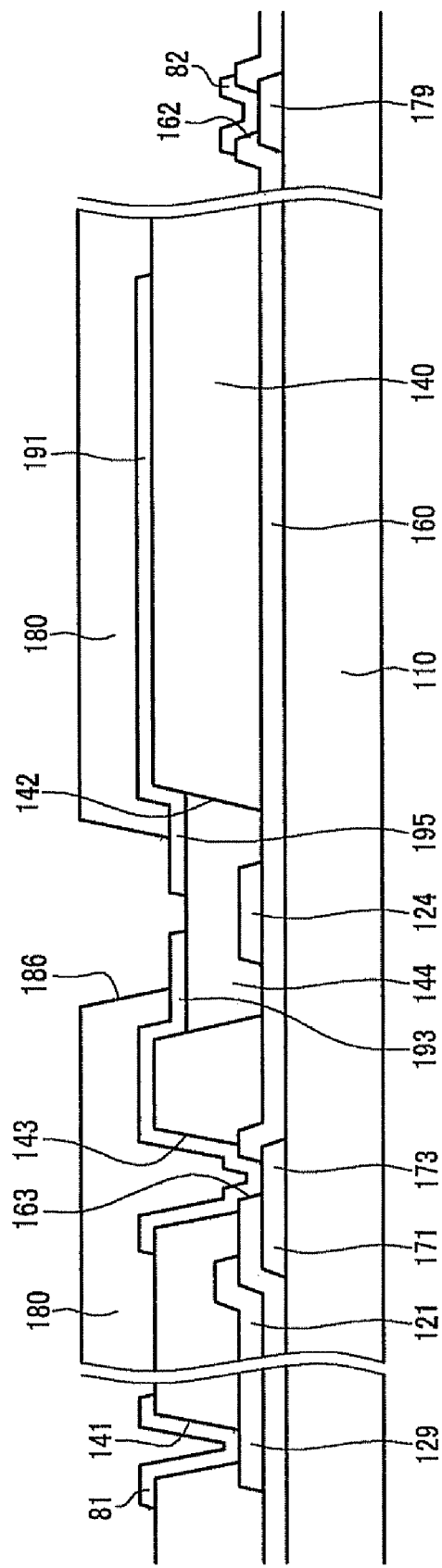
FIG. 19 is a cross-sectional view of the OTFT array panel shown in FIG. 18 taken along line XIX-XIX.

FIGS. 6, 8, 10, 12, 14, 16, and 18 are top plan layout views of the OTFT array panel shown in FIGS. 4 and 5 in intermediate steps of an exemplary embodiment of a manufacturing method thereof according to the present invention, FIG. 7 is a cross-sectional view of the OTFT array panel shown in FIG. 6 taken along line VII-VII, FIG. 9 is a cross-sectional view of the OTFT array panel shown in FIG. 8 taken along line IX-IX, FIG. 11 is a cross-sectional view of the OTFT array panel shown in FIG. 10 taken along line XI-XI, FIG. 13 is a cross-sectional view of the OTFT array panel shown in FIG. 12 taken along line XIII-XIII, FIG. 15 is a cross-sectional view of the OTFT array panel shown in FIG. 14 taken along line XIV-XIV, FIG. 17 is a cross-sectional view of the OTFT array panel shown in FIG. 16 taken along line XVII-XVII, and FIG. 19 is a cross-sectional view of the OTFT array panel shown in FIG. 18 taken along line XIX-XIX.

Referring to FIGS. 6 and 7, a conductive layer is deposited on a substrate 110 by any of several well known methods, one exemplary embodiment of which is sputtering, and is patterned by any of several well known methods, one exemplary embodiment of which is lithography and etching, to form a plurality of data lines 171 including projections 173 and end portions 179.

Referring to FIGS. 8 and 9, an interlayer insulating layer 160 including a plurality of contact holes 162 and 163 is formed by deposition and patterning. In one exemplary embodiment the deposition of the interlayer insulating layer 160 may be performed by chemical vapor deposition ("CVD") of an inorganic material.

Subsequently, as shown in FIGS. 10 and 11, a conductive layer is deposited on the interlayer insulating layer 160 and patterned by lithography and etching to form a plurality of gate lines 121 including gate electrodes 124 and end portions 129.

Referring to FIGS. 12 and 13, a photosensitive organic insulating film is spin-coated and patterned to form a lower partition 140 having a plurality of openings 142 and a plurality of contact holes 141 and 143. At this time, portions of the photosensitive organic insulating film near the end portions 179 of the data lines 171 are fully removed.

Referring to FIGS. 14 and 15 a plurality of gate insulators 144 are formed in the openings 142 of the lower partition 140 by inkjet printing, or other similar methods. The inkjet printing includes dripping and drying of a solution.

Referring to FIGS. 16 and 17, an amorphous ITO layer is deposited by sputtering, or another similar process, and patterned by lithography and etching to form a plurality of source electrodes 193, a plurality of pixel electrodes 191 including drain electrodes 195, and a plurality of contact assistants 81 and 82.

The sputtering of the amorphous ITO layer may be performed at a low temperature of about 25° C. to about 130° C. One exemplary embodiment of the process may be performed at room temperature. Exemplary embodiments of the etching of the amorphous ITO layer may be wet etching with a weak alkaline etchant. The low temperature and the weak alkaline etchant may reduce damage to the gate insulators 144 and the insulating layer 140 caused by heat and chemicals.

Referring to FIGS. 18 and 19, a photosensitive insulating layer is coated and subjected to light exposure and developing to form a plurality of upper partitions 180 having a plurality of openings 186.

Referring to FIGS. 4 and 5, a plurality of organic semiconductor islands 154 and a plurality of passivation members 146 are sequentially formed in the openings 186 by inkjet printing, or other similar methods.

In the above manufacturing process, the gate insulators 144 and the organic semiconductor islands 154 are formed using an inkjet printing method including dispersing an organic solution through a nozzle. Here, as shown in FIGS. 1-3, the thin film transistors which are collected at the regions of the thin film transistor array panel where the pair of gate lines and the pair of data lines cross may be formed by dispersing organic solutions through one nozzle.

On the other hand, because the thin film transistors not separated by data lines or gate lines are spaced away from the thin film transistors of the adjacent pixels by a larger interval, the organic solution dispersed through one nozzle into the pixels may be prevented from overflowing out the opening and flowing into adjacent pixels. Thereby the thickness of each pixel may be made more uniform.

As described above, the intervals between the thin film transistors of the adjacent pixels becomes narrow or wide, such that the inkjet process may be effectively executed, and furthermore the organic solution dispersed to pixels may be prevented from flowing into the adjacent pixels, Another exemplary embodiment of an OTFT array panel for a liquid crystal display according to the present invention will be described in more detail with reference to FIGS. 20 and 21.

Figure 20:
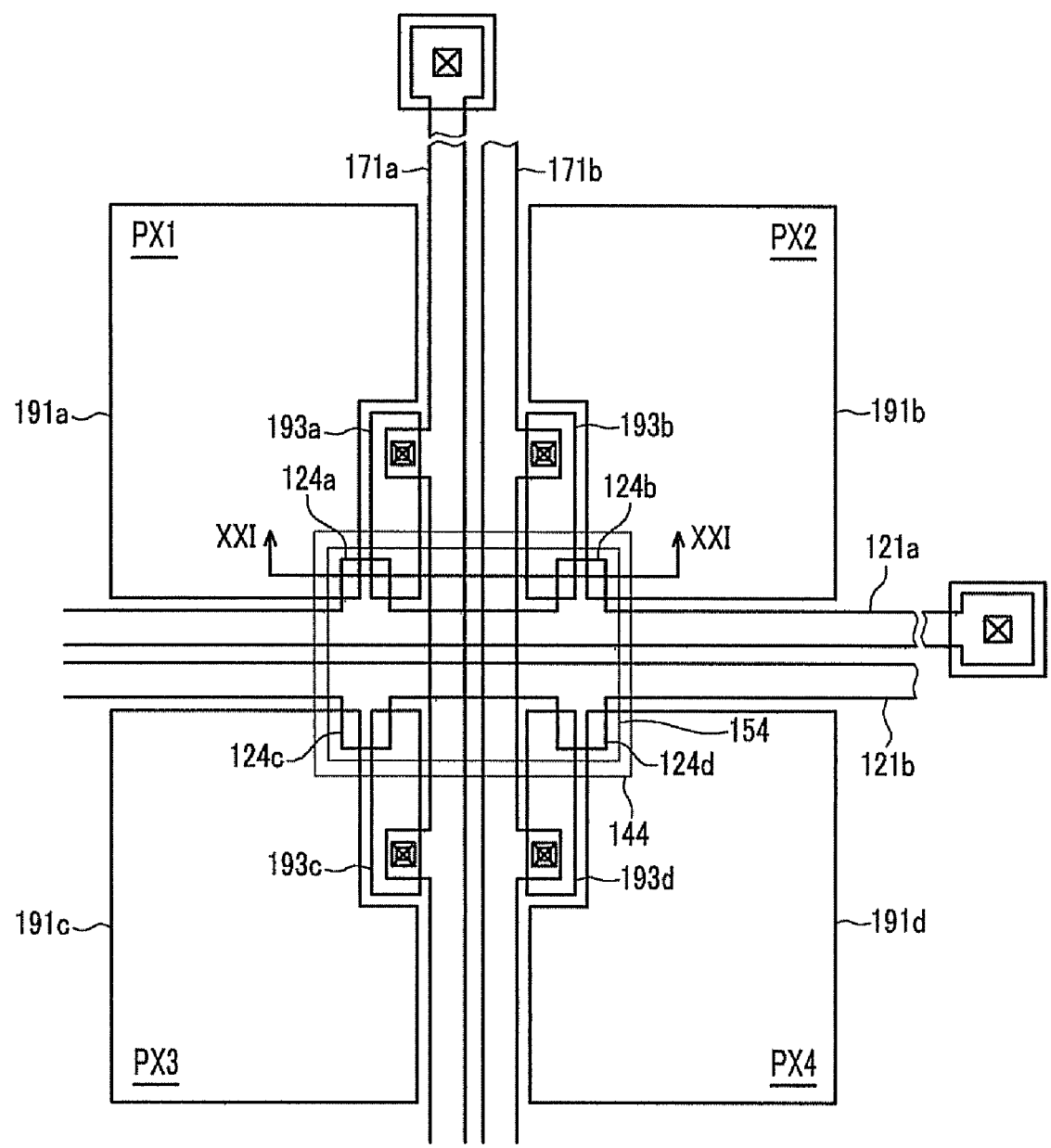
FIG. 20 is a top plan layout view of another exemplary embodiment of an OTFT array panel according to the present invention.
Figure 21:
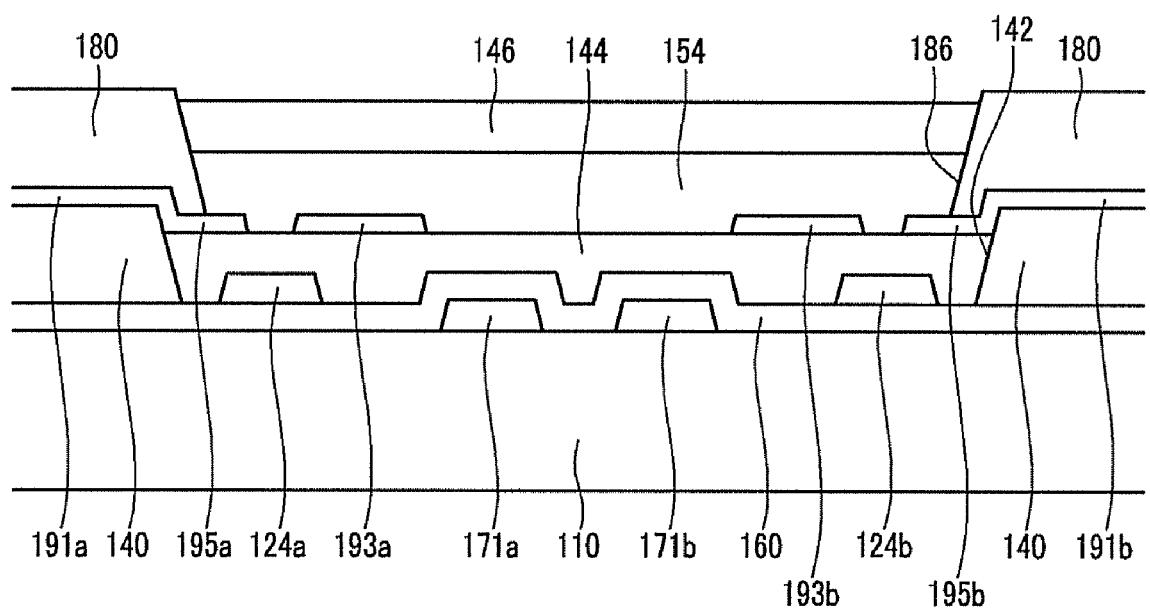
FIG. 21 is a cross-sectional view of the exemplary embodiment of an OTFT array panel shown in FIG. 20 taken along line XXI-XXI.

FIG. 20 is a top plan layout view of another exemplary embodiment of an OTFT array panel according to the present invention, and FIG. 21 is a cross-sectional view of the exemplary embodiment of an OTFT array panel shown in FIG. 20 taken along line XXI-XXI.

In order to differentiate the corresponding reference numerals of the adjacent pixels in FIGS. 20 and 21, 'a', 'b', 'c', and 'd' are respectively added to the numeral references of four pixels PX1, PX2, PX3, and PX4, respectively. Additionally the reference numerals which correspond to the elements unchanged from previous exemplary embodiment are omitted.

As shown in FIGS. 20 and 21, a plurality of data lines 171a and 171b are formed on a substrate 110.

The data lines 171a and 171b are respectively arranged in pairs and include a plurality of projections 173 (similar to that shown in FIG. 3) projecting aside and an end portion 179 having a large area for contact with another layer or an external driving circuit.

An interlayer insulating layer 160 is formed on the data lines 171a and 171b.

A plurality of gate lines 121a and 121b are formed on the interlayer insulating layer 160.

The gate lines 121a and 121b are respectively arranged in pairs, and include a plurality of gate electrodes 124a, 124b, 124c, and 124d projecting upward and downward.

A lower partition 140 is formed on the gate lines 121 and the interlayer insulating layer 160.

The lower partition 140 has a plurality of openings 142 exposing the gate electrodes 124a, 124b, 124c, and 124d.

A plurality of gate insulators 144 are formed in the openings 142 of the lower partition 140. The gate insulators 144 cover the gate electrodes 124a, 124b, 124c, and 124d, with the same gate insulator insulating the gate electrodes of the thin film transistors of all four pixels in common. The sidewalls of the openings 142 are higher than the gate insulators 144 such that the lower partition 140 serves as a bank against the gate insulators 144. The openings 142 have a size which is sufficient to allow the surfaces of the gate insulators 144 to flatten when they are deposited through an inkjet method.

The gate insulators 144 may be formed by an inkjet printing method, and the gate insulators 144 of the plurality of pixels PX1, PX2, PX3, and PX4 may be formed of a gate insulating solution which may be dispersed by one nozzle.

A plurality of source electrodes 193a, 193b, 193c, and 193d and a plurality of pixel electrodes 191a, 191b, 191c, and 191d are formed on the gate insulators 144 and the lower partition 140.

The source electrodes 193a, 193b, 193c, and 193d are connected to the data lines 171a and 171b and extend onto the gate electrodes 124a, 124b, 124c, and 124d.

Each of the pixel electrodes 191a, 191b, 191c, and 191d includes a drain electrode 195a, 195b, 195c, and 195d opposite a source electrode 193a, 193b, 193c, and 193d with respect to a gate electrode 124a, 124b, 124c, and 124d.

A plurality of upper partitions 180 are formed on the source electrodes 193a, 193b, 193c, and 193d, the pixel electrodes 191a, 191b, 191c, and 191d, and the lower partition 140.

The upper partitions 180 have a plurality of openings 186 disposed on the gate electrode 124a, 124b, 124c, and 124d and the openings 142 of the lower partition 140 for exposing portions of the source electrodes 193a, 193b, 193c, and 193d and the drain electrodes 195a, 195b, 195c, and 195d, and the portions of the gate insulators 144 therebetween which are part of the thin film transistors of the pixels PX1, PX2, PX3, and PX4.

A plurality of organic semiconductor islands 154 may be formed in the openings 186 of the upper partitions 180. The organic semiconductor islands 154 are disposed on the gate electrodes 124a, 124b, 124c, and 124d, and contact the source electrodes 193a, 193b, 193c, and 193d and the drain electrodes 195a, 195b, 195c, and 195d. The plurality of organic semiconductor islands 154 may each be made of one common pattern so that a single organic semiconductor island 154 is required for four pixels as shown in FIG. 20.

The organic semiconductor islands 154 may be formed by an inkjet printing method, and each large organic semiconductor island 154 may be formed of an organic semiconductor solution which is dispersed by one nozzle.

A plurality of passivation members 146 are formed on the organic semiconductor islands 154.

The plurality of passivation members 146 may also be formed by an inkjet printing method, and may be made of one pattern covering the organic semiconductor islands 154 of the plurality of thin film transistors.

This exemplary embodiment differs from the previous exemplary embodiments in that the organic semiconductor islands 154 and the gate insulators 146 which are formed by an inkjet printing are made of one common pattern in region of the organic thin film transistor array where the gate lines 121a and 121b and the data lines 171a and 171b cross.

Here, the openings 142 and 186 in which the organic semiconductor islands 154 and the gate insulators 142 are disposed must have a size which is sufficient for obtaining a process margin area where the organic solution is dripped such that the organic semiconductor solution and the gate insulating solution may have the flat surface. Accordingly, the thicknesses of organic thin films may be uniform in the channel of each pixel such that the characteristics of thin film transistor may be improved.

As above-described, because the intervals between the thin film transistors of adjacent pixels may be narrowed or widened in the present invention, the inkjet process may be effectively executed. Also, the organic solution may be prevented from flowing into other pixels, and the thicknesses of organic thin films may be uniform in the channel of each pixel such that the characteristics of thin film transistor may be improved.

Although exemplary embodiments of the present invention have been described in detail hereinabove, it should be clearly understood that many variations and/or modifications of the basic inventive concepts herein taught which may appear to those skilled in the present art will still fall within the spirit and scope of the present invention, as defined in the appended claims.

What is claimed is:

1. A thin film transistor array panel comprising:
a substrate;
a plurality of gate lines disposed on the substrate;
a plurality of data lines disposed on the substrate, wherein the plurality of gate lines and the plurality of data lines form a matrix pattern and wherein the gate lines and the data lines together define four pixels as a 2×2 matrix;
a plurality of thin film transistors in the pixels connected to the gate lines and the data lines, wherein each of the plurality of thin film transistors includes an organic semiconductor, wherein the plurality of thin film transistors comprises
a first thin film transistor is disposed in a lower right corner of the upper left pixel in the 2×2 matrix, a second thin film transistor is disposed in a lower left corner of the upper right pixel in the 2×2 matrix, a third thin film transistor is disposed in upper left corner of the lower right pixel in the 2×2 matrix, and a fourth thin film transistor is disposed in a upper right corner of the lower left pixel in the 2×2 matrix.

2. The thin film transistor array panel of claim 1, wherein the organic semiconductors of the thin film transistors of at the least two adjacent pixels are separated.

3. The thin film transistor array panel of claim 1, wherein the organic semiconductors of the thin-film transistors of the at least two adjacent pixels are joined.

4. The thin film transistor array panel of claim 1, wherein two of the gate lines are disposed between two adjacent pixels in a single column, and wherein two of the data lines are disposed between two adjacent pixels in a single row.

5. The thin film transistor array panel of claim 4, wherein the organic semiconductors of at the least two adjacent pixels are separated.

6. The thin film transistor array panel of claim 4, wherein the organic semiconductors of at the least two adjacent pixels are made of one pattern.

7. The thin film transistor array panel of claim 4, wherein the organic semiconductors include a soluble material.

8. The thin film transistor array panel of claim 7, further comprising a plurality of gate insulators formed between the gate lines and the organic semiconductors, wherein the gate insulators include a second soluble material.

9. The thin film transistor array panel of claim 8, further comprising:

a lower partition disposed on the substrate; and an upper partition disposed on the substrate;

wherein the gate insulators of the at least two adjacent pixels are disposed in at least one opening in the lower partition, and wherein the organic semiconductors of the thin film transistors of the at least two adjacent pixels are disposed in at least one opening in the upper partition.

10. The thin film transistor array panel of claim 8, further comprising a plurality of source electrodes connected to the data lines and a plurality of drain electrodes opposite the source electrodes with respect to the gate lines.

11. The thin film transistor array panel of claim 10, wherein the drain electrodes and the source electrodes include indium tin oxide or indium zinc oxide.

12. The thin film transistor array panel of claim 10, wherein the upper partition comprises an insulating layer formed on the source electrodes and the drain electrodes, wherein the insulating layer includes a plurality of openings that exposes portions of the source and drain electrodes, and the organic semiconductors are formed in the openings that exposes the portions of the source and drain electrodes.

13. The thin film transistor array panel of claim 12, wherein the openings of adjacent pixels are disposed proximate to one another.

14. The thin film transistor array panel of claim 1, wherein adjacent pixels have inversion symmetry.

* * * * *